US009100006B2

(12) United States Patent
Chi

(10) Patent No.: US 9,100,006 B2
(45) Date of Patent: Aug. 4, 2015

(54) 3D IC STRUCTURE AND METHOD

(71) Applicant: Taiwan Semiconductor Manufacturing Co., Ltd., Hsin-Chu (TW)

(72) Inventor: Shyh-An Chi, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/101,424

(22) Filed: Dec. 10, 2013

(65) Prior Publication Data
US 2014/0091834 A1  Apr. 3, 2014

Related U.S. Application Data

(63) Continuation of application No. 13/295,312, filed on Nov. 14, 2011, now Pat. No. 8,624,626.

(51) Int. Cl.
| H01L 23/538 | (2006.01) |
| H01L 21/50 | (2006.01) |
| H03K 19/0175 | (2006.01) |
| H03K 19/173 | (2006.01) |
| G11C 29/44 | (2006.01) |
| G11C 29/00 | (2006.01) |
| H01L 25/065 | (2006.01) |
| G11C 5/04 | (2006.01) |

(52) U.S. Cl.
CPC ........ *H03K 19/017581* (2013.01); *G11C 29/44* (2013.01); *G11C 29/886* (2013.01); *H03K 19/1737* (2013.01); *G11C 5/04* (2013.01); *H01L 25/0657* (2013.01); *H01L 2224/16145* (2013.01); *H01L 2224/16225* (2013.01); *H01L 2924/13091* (2013.01); *H01L 2924/15192* (2013.01)

(58) Field of Classification Search
USPC .............. 326/37, 39, 40, 41, 46, 47; 257/777, 257/773; 365/63
See application file for complete search history.

(56) References Cited

U.S. PATENT DOCUMENTS

| 5,498,975 | A | 3/1996 | Cliff et al. |
| 6,271,587 | B1 | 8/2001 | Patti |
| 2009/0121736 | A1 | 5/2009 | Jenkins et al. |
| 2010/0020585 | A1 | 1/2010 | Rajan |
| 2011/0090004 | A1 | 4/2011 | Schuetz |
| 2011/0110064 | A1 | 5/2011 | Foster, Sr. et al. |
| 2011/0110065 | A1 | 5/2011 | Foster, Sr. et al. |
| 2011/0131391 | A1 | 6/2011 | Barowski et al. |
| 2012/0124532 | A1* | 5/2012 | Coteus et al. ................. 716/104 |

OTHER PUBLICATIONS

Shamshri, S. et al., "Modeling Yield, Cost, and Quality of a Spare-enhanced Multi-core Chip", IEEE Transactions on Computers, 2009, pp. 1-14.

* cited by examiner

*Primary Examiner* — Daniel D Chang
(74) *Attorney, Agent, or Firm* — Duane Morris LLP; Steven E. Koffs

(57) ABSTRACT

An apparatus comprises a first integrated circuit (IC) die, and a second IC die stacked on the first IC die. The first and second IC dies are operational independently of each other. Each respective one of the first and second IC dies has: at least one circuit for performing a function; an operation block coupled to selectively disconnect the circuit from power; and an output enable block coupled to selectively connect the circuit to at least one data bus.

22 Claims, 8 Drawing Sheets

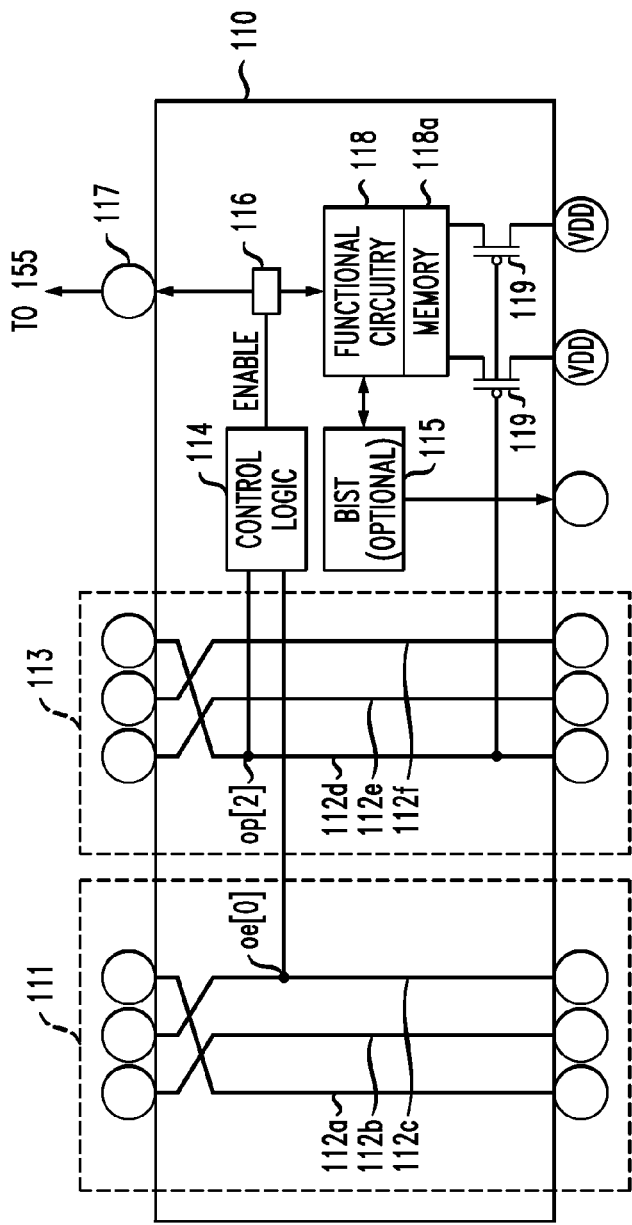
FIG. 2
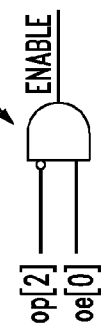
FIG. 4
FIG. 3

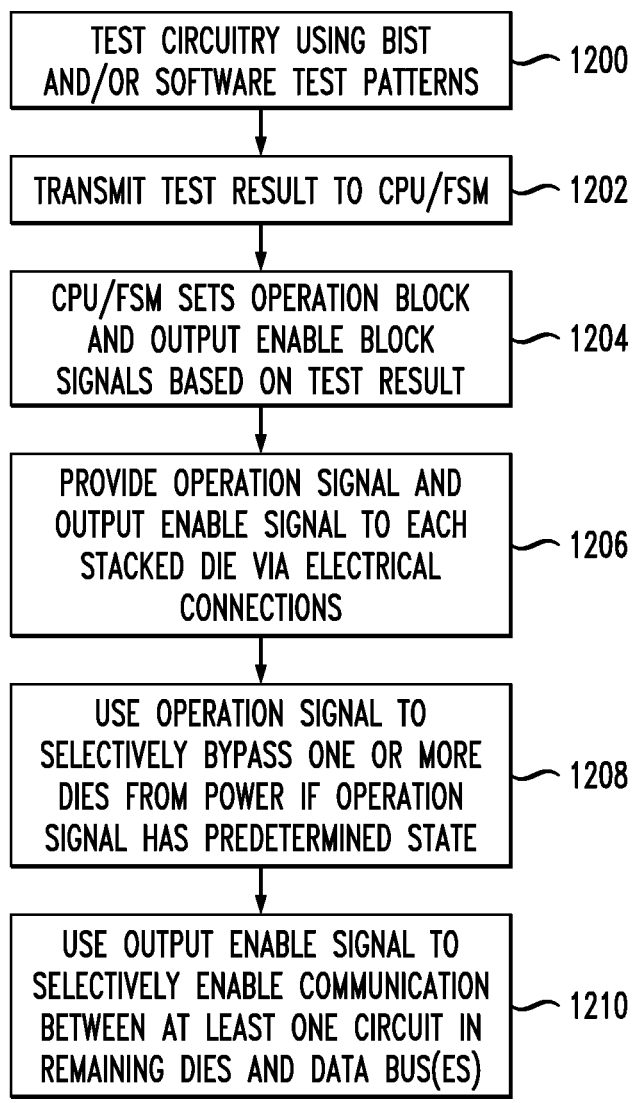

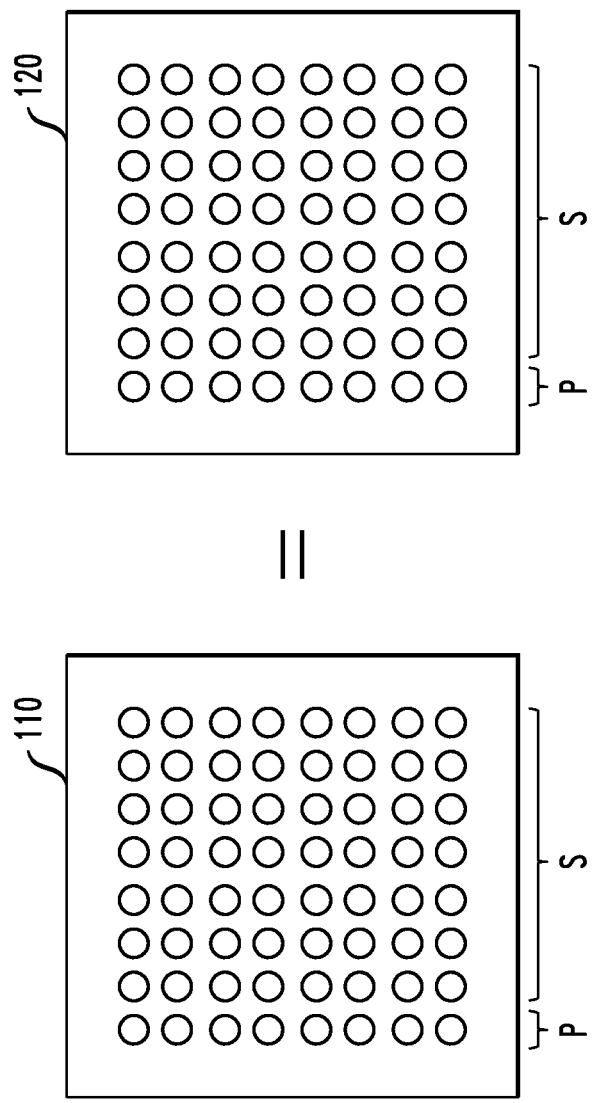

3D IC STRUCTURE AND METHOD

CROSS-REFERENCE TO RELATED APPLICATIONS

This application is a continuation of U.S. patent application Ser. No. 13/295,312, filed Nov. 14, 2011, which is expressly incorporated by reference herein in its entirety.

FIELD

The present disclosure relates to semiconductor integrated circuits (IC) generally, and more particularly to packages including stacked dies, also referred to as 3D ICs.

BACKGROUND

A 3D IC package contains two or more integrated circuit dies (ICs) stacked vertically so that they occupy less space. Connections between the vertically stacked ICs may be made using through-semiconductor-vias, also referred to as through-silicon-vias (TSV), which pass through the entire thickness of a die, permitting connections between conductive patterns on the front face and back face of the die. The resulting package has no added length or width.

3D IC packages present new challenges for fabrication and verification. Assuming that only known good dies are included in the 3D IC package, one of the stacked dies may be damaged during the packaging process. Once the stacked dies have been incorporated into an encapsulated 3D IC package, it is no longer practical to repair or replace one of the dies.

BRIEF DESCRIPTION OF THE DRAWINGS

FIG. 2 is a block diagram of an embodiment of one of the dies of FIGS. 1A and 1B.

FIG. 3 is a diagram of an embodiment of the control logic of FIG. 2.

FIG. 4 is a diagram of the bus access switch of FIG. 2.

FIG. 12 is a flow chart of a method.

FIG. 13 shows contact maps for power and signals for two dies.

DETAILED DESCRIPTION

Figure 1A:
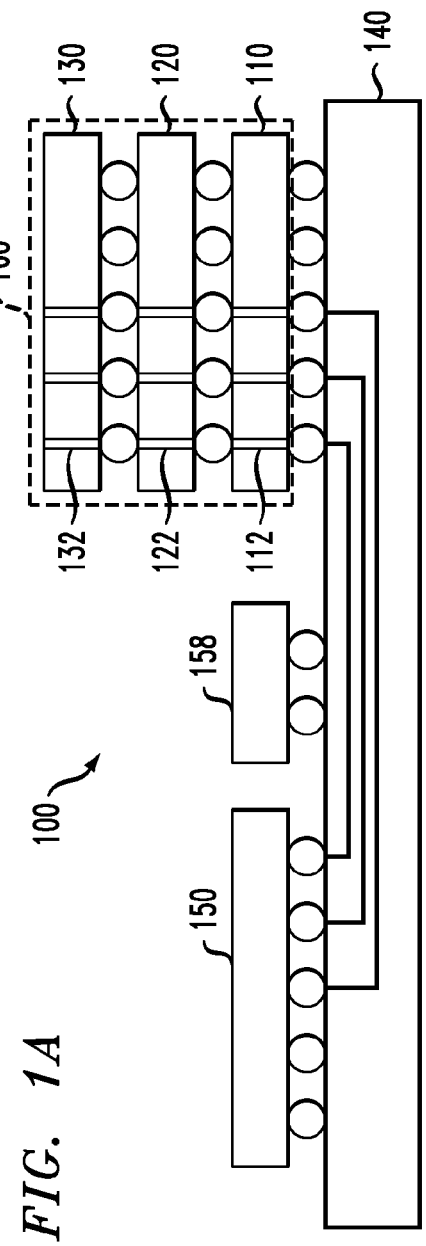
FIG. 1A is an example of a 3D IC mounted on a silicon interposer.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, unless expressly described otherwise.

Figure 1B:
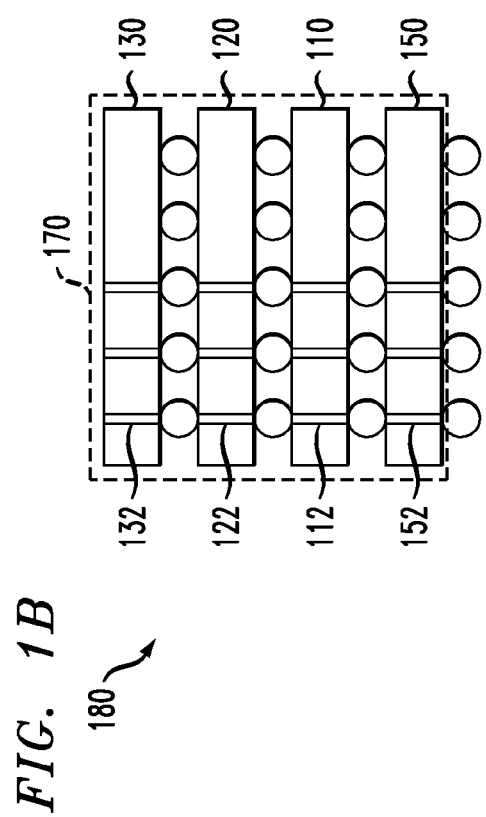
FIG. 1B is an example of a 3D IC.

FIGS. 1A and 1B are block diagrams of an apparatus 100 or 180. The apparatus 100, 180 includes a plurality of stacked integrated circuit (IC) dies 110, 120, 130 in 3D IC package 160, 170. In some embodiments, two of the dies are similarly configured, so that one of the two dies can be substituted for the other in the event of a failure, and the failed die can be bypassed. A variety of die types may be included, depending on the type of apparatus 100 and functions performed by the apparatus. For example, the apparatus 100, 180 may be the main processor of a laptop computer, a tablet computer, a smart phone, an audio/video player, a cellular phone, a video game console, a television, a radio, or other electronic device.

In some embodiments (e.g., FIG. 1B), the apparatus 180 is a complete system in package (SiP), in which IC 150 is a general purpose processor, and ICs 110, 120 and 130 may be any combination of dynamic random access memory (DRAM), a graphics processor, an audio/video processor, a digital radio receiver, a flash memory (or other solid state memory), a communications processor (which may include a WiFi (802.11) interface, a global positioning satellite (GPS) receiver, a Bluetooth interface, a second processor, a power management unit or other communications interface used by the apparatus 100. These die types are only listed as examples, and are not exclusive of other types of dies. Although FIG. 1B shows a 3D IC 180 having four stacked dies 150, 110, 120, 130, the 3D IC may have any desired number of dies to perform the functions of the product in which the 3D IC is installed.

In other embodiments (e.g., FIG. 1A), the 3D IC package 160 containing IC dies 110, 120, 130 is optionally mounted to a semiconductor interposer (e.g., a silicon interposer) 140, in a 2.5D IC configuration. The interposer 140 has one or more additional IC dies 150, 158 mounted horizontally from the 3D IC 160. In one non-limiting example, the IC die 150 is the main system processor, die 158 is a system bus, and IC dies 110, 120 and 130 are three identical DRAM dies. In some examples, the IC dies 110, 120 and 130 are three different SRAM dies with similar contact maps for power and signals. For example, die 110, 120 and 130 may contain 1M bits, 2M bits, 4M bits of SRAM respectively, but their contact maps for power and signals are similar. For example, FIG. 13 shows two dies 110, 120, in which the first die 110 has a contact map for power P and signals S; and the second die 120 has a contact map for power P and signals S that matches the contact map of the first die.

For ease of explanation, an example below refers to the three DRAM dies 110, 120 and 130 and a central processing unit (CPU) or finite state machine (FSM) 150. However, the discussion is not limited to the 2.5D IC configuration of FIG. 1A, and the dies 110, 120, 130 are not limited to DRAM. For example, the discussion below also applies to a stack 170 of four dies, 150, 110, 120, 130, (FIG. 1B) in which the bottom die 150 is the core processor, and the dies 110, 120 and 130 are stacked on die 150 in a single 3D IC SiP configuration 180.

The IC dies 110, 120, 130 are connected to each other by electrical connections, such as through substrate vias (TSV) 112, 122, 132, (also referred to as through-silicon vias in the case where the IC dies are fabricated on a silicon substrate), metal patterns, conductive vias, redistribution layer or the like. The discussion herein applies to IC dies fabricated on any type of semiconductor substrate. Although FIG. 1 only shows three electrical connections 112, 122, 132 per die, this is just for illustrative purpose. Any number of electrical connections may be provided for power, ground and signals, where the signals may include clock, device enable signals and data.

Referring now to FIG. 1B, an apparatus comprises N stacked integrated circuit (IC) dies 110, 120, 130, where N is an integer greater than one. Each one of the IC dies 110, 120, 130 may be operated independently of each other IC die. For example, two of the three dies 110, 120 and 130 may be operating, while the remaining one of the three dies is bypassed. A variety of means may be used to bypass one of the dies, including but not limited to disconnecting the one die from power, or clock gating of functional circuitry in the die.

By way of example, FIG. 2 schematically shows stacked die 110. Stacked dies 120 and 130, although not shown in FIG. 2, may include the same components shown in FIG. 2. IC die 110 has: at least one circuit 118 (which may include memory 118a) for performing a function; an output enable block 111 coupled to selectively connect the circuit 118 to at least one data bus 155, the output enable block 111 in IC die 110 comprising N output enable electrical connections 112a-112c, one of the output enable electrical connections 112c corresponding to that one IC die. Control logic 114 is coupled to the circuit 118 and to the output enable electrical connections 112c corresponding to the one IC die. The control logic 114 is configured so that the circuit 118 only outputs data to the at least one data bus 155 when the output enable electrical connections 112c of the one IC die 110 carries a signal having a predetermined logic state (e.g., logic high).

The functional circuitry block 118 performs the functions of the die. For example, if IC die 110 is a DRAM die, then the functional circuitry block 118 contains the DRAM array. In some embodiments, an optional built-in self test (BIST) block 115 is provided, corresponding to the functional circuitry block 118. The BIST block 115 tests the functional circuitry block 118, and reports the result to the CPU or FSM 150. In other embodiments, software test patterns can be used to test the functionalities of functional circuitry block 118.

An operation block 113 is coupled to selectively bypass a corresponding die from normal operations of the stacked dies. In the example of FIG. 2, the respective operation block 113 of die 110 has a plurality of electrical connections 112d-112f through the respective IC die and coupled to the circuit 118, such that when a first one of the electrical connections 112d has a first signal with a first predetermined logic state, the corresponding die 110 is bypassed from the normal operations of the stacked dies.

In some embodiments, one of the dies 110, 120, 130 is redundant. The redundant die is similar with the N stacked integrated circuit dies, so that at any given time, one of the dies is bypassed, and the other dies are operational. In other embodiments, the apparatus includes at least four IC dies 150, 110, 120, 130, of which at least two of the IC dies are redundant dies, and the operation block is configured to be coupled to selectively bypass at least two dies from operations.

In some embodiments, to bypass a die from the normal operations of the stacked dies, that die is removed from the power (Vdd) that is provided for the functional circuitry 118. For example, in some embodiments, the first one of the electrical connections 112d is connected to the gate(s) of one or more P-type MOSFET 119. The source of the transistor is coupled to the circuit of functional circuitry 118, and a drain of the transistor is coupled to a supply voltage. When the gate of transistor 119 is in the logic low state, the transistor is turned on, and current flows from the source to the drain. If, however, the first signal on electrical connections 112d is set to a logic high state, the transistor is turned off, and no current flows.

Although FIG. 2 shows P-type MOSFET transistors 119 used for selectively disconnecting the functional circuitry 118 from Vdd, other types of transistors or other types of switches may be used. For example, one of ordinary skill in the field can readily construct a configuration using N-type MOSFETs.

The operation block 113 in each IC die is configured with N operation block electrical connections to control N IC dies, where N is an integer. For example, with three IC dies, 110, 120, 130, there are three electrical connections 112d, 112e, 112f. Thus, if there are more than three stacked dies, the number of electrical connections in the operation block 113 is increased accordingly. In some embodiments, the operation block 113 in each IC die is configured with M electrical connections to control N IC stacked dies, where M is larger than N. For example, the operation block 113 in each IC die is configured with three electrical connections to control two IC stacked dies to meet specific system/functional requirements and re-use the existing IC die.

Each operation block electrical connections 112d-112f in each IC die 110, 120, 130 is configured to connect to a successive operation block electrical connections in an adjacent one of the IC dies. Thus, if a logic high ("1") signal is provided on the electrical connections 112d of the die 110, the logic high signal is transmitted to the electrical connections 112f of die 120 and to the TSV 112e of die 130. One of ordinary skill in the art appreciates that the rotation can be round-robin in either direction. For example, in an alternative embodiment (not shown), if a logic high ("1") signal is provided on the electrical connections 112d of the die 110, the logic high signal is transmitted to the electrical connections 112e of die 120 and to the electrical connections 112f of die 130.

Thus, within each of the stacked dies 110, 120, 130 in FIG. 1, the signal level of the electrical connections 112d (most significant bit, or MSB) in FIG. 2 determines whether the corresponding die is selectively bypassed from normal operations of the stacked dies. For example, values of 1,0,0 in electrical connections 112d, 112e, 112f respectively causes that die being bypassed from normal operations of the stacked dies.

A full table of the state and operation switch value for each die, with one of the stacked dies bypassed from normal operations, is provided in Table 1. Note that Table 1 presents three different cases, with a different die bypassed from normal operations in each case.

TABLE 1

| Die | Die State | Operation Block Values |
|-----|-----------|------------------------|
| 130 | functional | 010 |
| 120 | functional | 001 |
| 110 | bypassed | 100 |
| 130 | functional | 001 |
| 120 | bypassed | 100 |
| 110 | functional | 010 |
| 130 | bypassed | 100 |
| 120 | functional | 010 |
| 110 | functional | 001 |

Although an example is provided in which the MSB op[2] of the operation block 113 is used to bypass the die, in other embodiments, any predetermined bit of the operation switch may be used.

Although the functional circuitry 118 of one of the dies may be bypassed by disconnecting that circuitry from Vdd, the electrical connections 112a-112f of that die continue to conduct signals to an adjacent die above. For example, when the functional circuitry 118 of die 110 is disconnected from Vdd, the electrical connections 112a-112f pass the output enable and operation block signals to die 120, which in turn passes the signals to die 130.

In the embodiment of FIG. 2, the die 110 further includes an output enable block 111. In FIG. 1A, 1B and FIG. 2, the IC dies 110, 120, 130 share a common data bus 155. An output enable block 111 is coupled to selectively connect the circuit of functional circuitry block 118 to at least one data bus 155 by way of the contact bump 117.

The respective output enable block 111 has a plurality of electrical connections 112a-112c through each respective IC die 110, 120, 130. Each IC die 110, 120, 130 further comprises respective control logic 114 coupled to receive an output enable signal, for example oe[0] in FIG. 2, from the respective output enable block 111 of that IC die. Each IC die is configured, such that the circuit is only connected to the at least one data bus when a respective bit of the output enable signal corresponding to that IC die has a predetermined logic state (e.g., logic high). For example, the functional circuitry 118 only outputs data to the at least one data bus 155 when the output enable electrical connections 112c of the one stacked die 110 carries a signal having a logic high level.

The data bus 155 may be integrated within the processor 150, or one or more separate data bus chips 158 may be provided. The output enable block 111 enables bus access, one at a time, to each of the dies 110, 120, 130 for which the corresponding die is not bypassed. In the example, bus access is provided to each die 110, 120, 130 in round robin fashion.

Each output enable block electrical connections 112a-112c in each IC die 110, 120, 130 is configured to connect to a successive output enable block TSV in an adjacent one of the IC dies. Thus, if a logic high ("1") signal is provided on the TSV 112c of the die 110, the logic high signal is transmitted to the TSV 112b of die 120 and to the TSV 112a of die 130. One of ordinary skill in the art appreciates that the rotation can be round-robin in either direction. For example, in an alternative embodiment (not shown), if a logic high ("1") signal is provided on the electrical connections 112c of the die 110, the logic high signal is transmitted to the electrical connections 112a of die 120 and to the electrical connections 112b of die 130.

Thus, within each of the stacked dies 110, 120, 130 in FIG. 1, the signal level of the output enable electrical connections 112c (least significant bit, or LSB) in FIG. 2 determines whether the functional circuitry 118 in that die is selected to communicate with the shared data bus 155. For example, values of 0, 0, 1 in electrical connections 112a, 112b, 112c respectively, and cause the functional circuitry 118 within that die to be provided bus access.

The output enable block values are shifted among the active IC dies during successive cycles. Table 2 shows the values during two successive cycles. Note that Table 2 presents three different cases, with a die being bypassed from normal operations of the stacked die in each case. Thus for a given case, during one of the cycles, a value, based on different cases, is chosen to be applied on output enable block 111 of stacked die 110.

TABLE 2

| Die | Die State | Output Enable Block Values (1st cycle) | Output Enable Block Values (2nd cycle) |
| --- | --- | --- | --- |
| 130 | functional | 010 | 001 |
| 120 | functional | 001 | 100 |
| 110 | bypassed | 100 | 010 |
| 130 | functional | 100 | 001 |
| 120 | bypassed | 010 | 100 |
| 110 | functional | 001 | 010 |
| 130 | bypassed | 100 | 010 |
| 120 | functional | 010 | 001 |
| 110 | functional | 001 | 100 |

For example, in the first case of Table 2, the CPU/FSM 150 decides to bypass the first die 110. In the 1st cycle the value that the CPU/FSM applied to the output enable block 111 of the first die 110 will be 100. As a result, in the 1st cycle the second die 120 will output data. Moreover, in the 2nd cycle, the CPU/FSM 150 applies 010 to the output enable block 111 of the first die 110; in the second die 120 the value is 100, and the output is disabled, because the LSB is 0. In the third die 130, the output enable value is 001; the LSB is "1", so output is enabled, and in this cycle the third die 130 is allowed access to output data.

Referring again to FIG. 2, the control logic block 114 receives the LSB oe[0] from output enable block electrical connections 112c and the MSB op[2] from operation block electrical connections 112d. The control logic 114 issues an enable signal to allow the functional circuitry 118 of the die 110 to access the shared data bus 155 if the LSB oe[0] from output enable block electrical connection 112c has a logic high value ("1") and the MSB op[2] from operation block electrical connections 112d has a logic low value ("0"). In other words, the CPU or FSM causes the apparatus 100 to cycle through all of the IC dies in a round-robin fashion.

Thus, the first electrical connection 112d is coupled to control logic 114; the control logic 114 being configured to discontinue communication between the circuit 118 and the at least one data bus 155 if the first signal op[2] has the first predetermined logic state ("1"). A second electrical connection 112c is coupled to the control logic 114 for transmitting a second signal oe[0], such that the circuit 118 only outputs data to the at least one data bus 155 when the first signal op[2] has the first predetermined logic state ("0"), and the second signal oe[0] has a second predetermined logic state ("1").

The output enable block in each IC die is configured with N output enable electrical connections to control N IC dies, where N is an integer. In the example of FIG. 1 and FIG. 2, there are three output enable electrical connections 112a-112c to control the three dies 110, 120, 130. Each output enable electrical connections 112a, 112b, 112c in each IC die is configured to connect to a successive output enable electrical connections 112c, 112b, 112a, respectively, in an adjacent one of the IC dies. That is, electrical connection 112a in die 110 connects to electrical connection 112c in die 120, electrical connection 112b in die 110 connects to electrical connection 112a in die 120, and electrical connection 112c in die 110 connects to electrical connection 112b in die 120. In other embodiments, the order of this rotation can be different. For example, in another embodiment, electrical connection 112a in die 110 connects to electrical connection 112b in die 120, electrical connection 112b in die 110 connects to electrical connection 112c in die 120, and electrical connection 112c in die 110 connects to electrical connection 112a in die 120. In some embodiments, the output enable block in each IC die is configured with M output enable electrical connections to control N IC dies, where M and N are integers, and M is larger than N. For example, in one embodiment, the output enable block in each IC die is configured with three output enable electrical connections to control two IC dies.

Although an example is provided in which the LSB oe[0] of the output enable block 111 is used to control the control logic 114, in other embodiments, any predetermined bit of the output enable block 111 may be used.

In some embodiments, the values provided to the operation block 113 are only changed infrequently. For example, the CPU/FSM 150 may only set operation block values immediately after the CPU/FSM 150 is powered on, or at an infrequent interval (e.g., daily). On the other hand, the CPU/FSM 150 provides new values to the output enable block 111 with each database access cycle.

FIG. 3 shows an example of control logic 114 for implementing this rotation. The LSB oe[0] from output enable block electrical connection 112c is provided to one input of the AND gate 114 and the MSB op[2] from operation block electrical connection 112d is inverted and provided to the other input of the AND gate 114. If both of the conditions are met, the AND gate 114 outputs a logic high enable signal. One of ordinary skill in the art can readily design alternative control logic to perform the function of AND gate 114 in various embodiments. For example, if transistors 119 are replaced by N-type MOSFETs, then the signal op[2] is not inverted at the input to AND gate 114.

FIG. 4 shows an example of the switching mechanism 116. The switching mechanism 116 within the IC die 110. The enable signal received from control logic 114 is inverted by inverter 116a. The inverted signal is then provided to a switch, such as a transmission gate 116b. The switching mechanism allows the IC die 110 to access the shared data bus 155 during its scheduled turn, and does not allow the IC die 110 to access the shared data bus at other times.

In operation, the BIST block 115 in each die runs a self test operation, and provides the result to the CPU or FSM 150. (In embodiments having no BIST, the CPU/FSM can run test sequences to check the function of the functional circuitry 118). The CPU or FSM 150 sets the value of the operation block signals op[2:0] and the output enable signals oe[2:0], based on the results from the BIST block 115. The operation block MSB op[2] is used to control the transistors 119 to connect or disconnect the IC die 110 to power. The operation block MSB op(2) and the output enable LSB oe(0) are provided to the control logic to control the transmission gate 116b of switch 116, to only allow the functional circuitry 118 of die 110 to communicate with the shared data bus 155 during its assigned time slot.

For ease of explanation, in this example, the dies 120 and 130 are identical to die 110. However, in other embodiments, each die has a respectively different functional circuitry block 118 and BIST block 115.

Figure 6A:
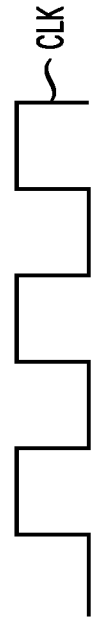
FIGS. 6A to 6G are timing diagrams showing the clock, operation block, and output enable signal values.
Figure 6B:
Figure 6C:
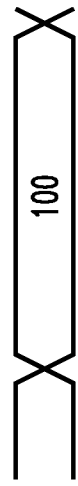
Figure 6D:
Figure 6E:
Figure 6F:
Figure 6G:
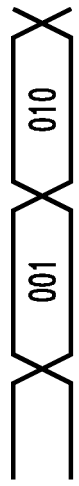
Figure 5:
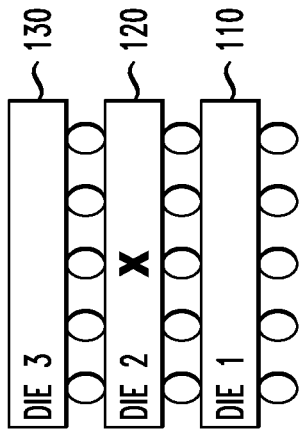
FIG. 5 is a diagram of the die stack of FIG. 1A, with a failed (or spare) middle die.

FIGS. 5 and 6A-6G show an example, in which the second die 120 is to be bypassed (e.g., because of a failure detected by the BIST circuit 115). FIG. 6A shows the clock signal CLK. FIG. 6B shows the operation block bits op[2:0] for die 130. The MSB is 0, so the die is in functional operation. FIG. 6C shows the operation block bits op[2:0] for die 120. The MSB is 1, so the die is bypassed. FIG. 6D shows the operation block bits op[2:0] for die 110. The MSB is 0, so the die is in functional operation. FIG. 6E shows the output enable block bits oe[2:0] for die 130 during two consecutive bus access cycles. During the first cycle, the LSB is 0, so die 130 does not have bus access. During the second cycle, the LSB is 1, so die 130 has bus access. FIG. 6F shows the output enable block bits oe[2:0] for die 120. During both cycles, the LSB is 0, so die 120 does not have bus access. FIG. 6G shows the output enable block bits oe[2:0] for die 110. During the first cycle, the LSB is 1, so die 110 has bus access. During the second cycle, the LSB is 0, so die 110 does not have bus access.

Figure 7:
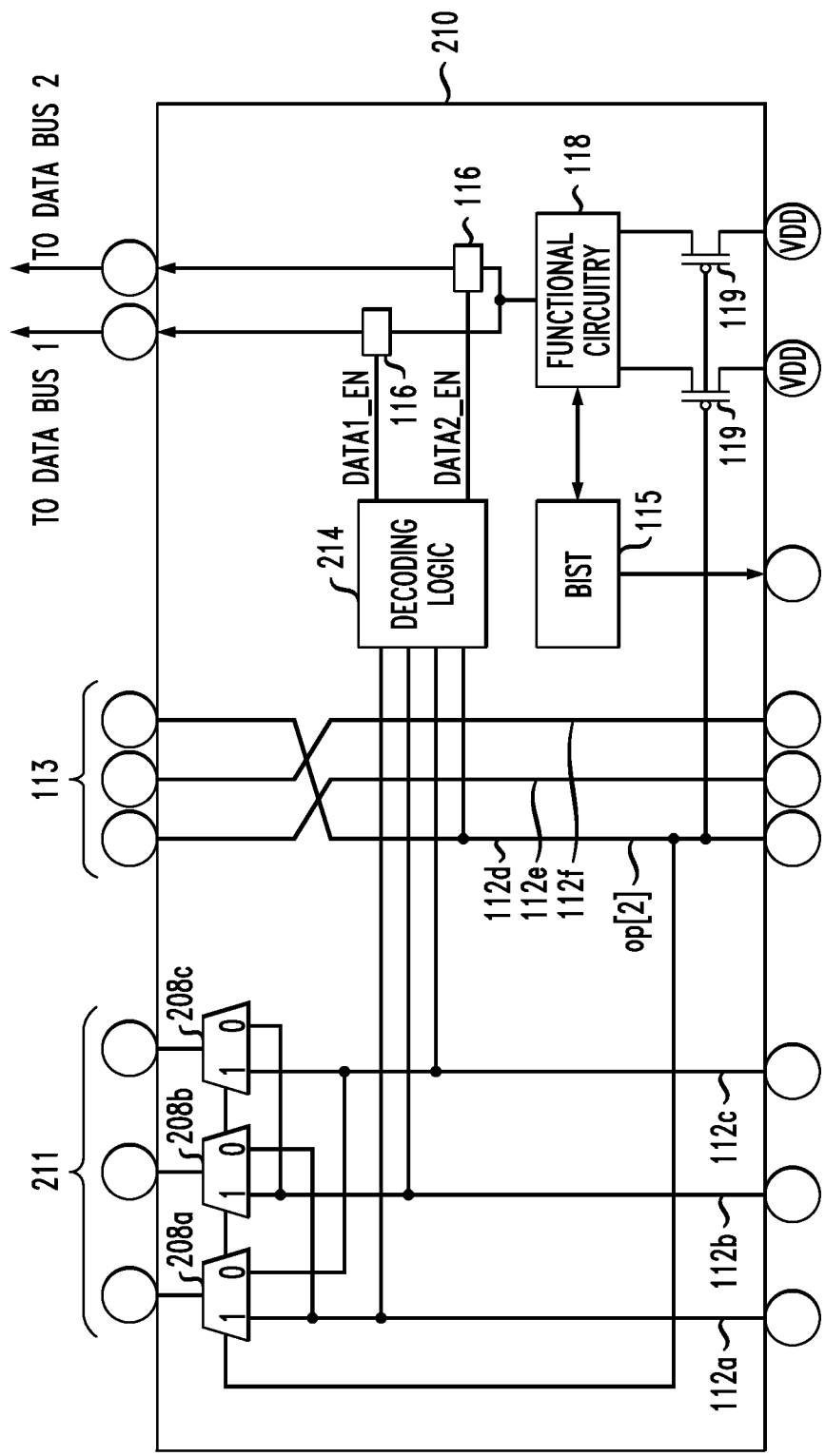
FIG. 7 is a block diagram of a second embodiment of one of the IC dies of FIG. 1A or 1B.
Figure 8:
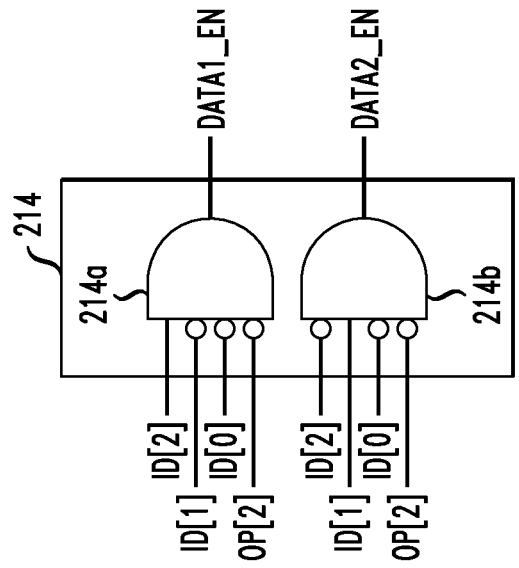
FIG. 8 is a plan view of the IC die of FIG. 7.

FIG. 7 is a block diagram of an alternative embodiment adapted for use in systems having plural data buses. For example, data bus 1 may be an instruction bus, and data bus 2 may be used for payload data. In other embodiments, either bus may be used for transmitting instructions or data. In this embodiment, the various circuit elements combine to allow two of the IC dies to access the data buses 1 and 2 at the same time. FIG. 7 only shows a single die 210, but the structures shown in FIG. 7 may be replicated in each die of the 3D IC. FIG. 8 is a plan view of an embodiment of the die 210.

Several of the structures in IC die 210 are the same as discussed above with reference to IC die 110, including functional circuitry 118, BIST 115, operation block 113 and transistors 119. Descriptions of these elements are not repeated, for brevity.

In FIG. 7, the output enable block 211 includes a plurality of multiplexers 208a-208c. Each multiplexer 208a, 208b, 208c receives one of its input signals from its respective electrical connections 112a, 112b, 112c. Each multiplexer 208a, 208b, 208c receives as its second input signals from an adjacent electrical connections 112c, 112a, 112b in the rotation. Thus, the first input of each multiplexer is connected to a second input of a succeeding multiplexer in round-robin fashion. The MSB op[2] of the operation block 113, from electrical connection 112d is used as the mux select signal for controlling each multiplexer 208a-208c to select either its first or second input. The selected signal is then output from each multiplexer 208a-208c. Thus, if a die has the MSB op[2] of its operation block electrical connection 112d set to "1", each of the multiplexers 208a-208c pass the output enable signal received from the bottom bumps to the next die above, without shifting ID[2:0]. On the other hand, if a die has the MSB op[2] of its operation block TSV 112d set to "0", each of the multiplexers 208a-208c pass the output enable signal received from the input to an adjacent die, so that the values transmitted to the die above are shifted. In FIG. 7, the output enable block in each of the IC dies is configured with three sets of multiplexer and electrical connection to control three IC dies. In some embodiments, the output enable block in each IC die is configured with M sets of multiplexer and electrical connections to control N IC dies, where M and N are integers, and M is larger than N. For example, in one embodiment, the output enable block in each IC die is configured with three sets of multiplexer and electrical connection to control two IC dies.

In place of the control logic 114, the die 210 has decoding logic 214. The decoding logic receives the MSB op[2] of the operation block 113 from electrical connection 112d, and also receives the output enable block values from electrical connections 112a-112c.

Figure 9:
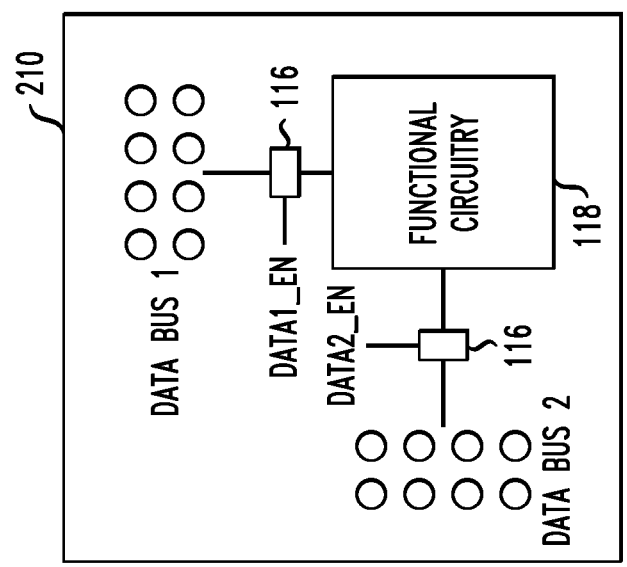
FIG. 9 is a block diagram of the decoding logic of FIG. 7.

FIG. 9 is a diagram of one example of the decoding logic 214. The decoding logic 214 comprises three inverters for each AND gate 214a, 214b. Decoding logic 214 includes two four-input AND gates 214a, 214b. AND gate 214a receives an inverted version of the MSB op[2] of the operation block 113 from electrical connection 112d, and also receives the output enable block value ID[2] from electrical connection 112a and inverted versions of ID[1] and ID[0] from electrical connections 112b and 112c. Thus, AND gate 214a implements the logic equation:

data1_en=ID[2] and ID[1]bar and ID[0]bar and OP[2]bar    (1)

where the values of Die ID are input by the CPU or FSM 150 in a similar manner to the output enable vector oe[2:0] described above in FIG. 2. The values assigned to Die ID are listed in Table 3 below.

AND gate 214b receives an inverted version of the MSB op[2] of the operation block 113 from electrical connection 112d, and also receives the output enable block value ID[1] from electrical connection 112b and inverted versions of ID[2] and ID[0] from electrical connections 112a and 112c. Thus, AND gate 214b implements the logic equation:

$$\text{data2\_en} = \text{ID[2]bar and ID[1] and ID[0]bar and OP[2]bar} \quad (2)$$

Given equations (1) and (2), for any given die, for any given bus access cycle, data1_en and data2_en cannot both be set to a logic high value. (ID[2] and ID[2]bar cannot both be logic high; and ID[1]bar and ID[1] cannot both be logic high). Thus, a given die, at most, has access to one of the data buses during a single bus access cycle. The decoding logic 214 outputs data1_en and data2_en to the switches 116 for controlling access to the data buses 1 and 2. The functional circuitry 118 is selectively connectable to each of the first and second data buses. The respective output enable block 211 in each IC die 210 is configured to selectively connect the respective circuit 118 in that IC die to one of the first and second data buses, based on the truth table in Table 3. As in the example of FIG. 2 and Table 1, when the operation block value is 100 (i.e., the MSB, op[2] is logic high), the corresponding die is bypassed.

TABLE 3

| Die | Die State | Output Enable Block DIE ID | Operation Block Values |
|---|---|---|---|
| Top | functional | 010 | 010 |
| Middle | functional | 100 | 001 |
| Bottom | bypassed | 100 | 100 |
| Top | functional | 010 | 001 |
| Middle | bypassed | 010 | 100 |
| Bottom | functional | 100 | 010 |
| Top | bypassed | 001 | 100 |
| Middle | functional | 010 | 010 |
| Bottom | functional | 100 | 001 |

In embodiments having two or more data buses, the decoding logic 214 includes a respective AND gate 214a, 214b for each respective data bus, the AND gate having a respective input for each of the three IC dies and for the operation block. Thus a third bus can be accommodated by using five-input AND gates (which can be provided by cascading two 3-input AND gates), and a fourth bus can be accommodated by using six-input AND gates (which can be provided by cascading a 3-input AND gate and a 4-input AND gate).

Figure 11:
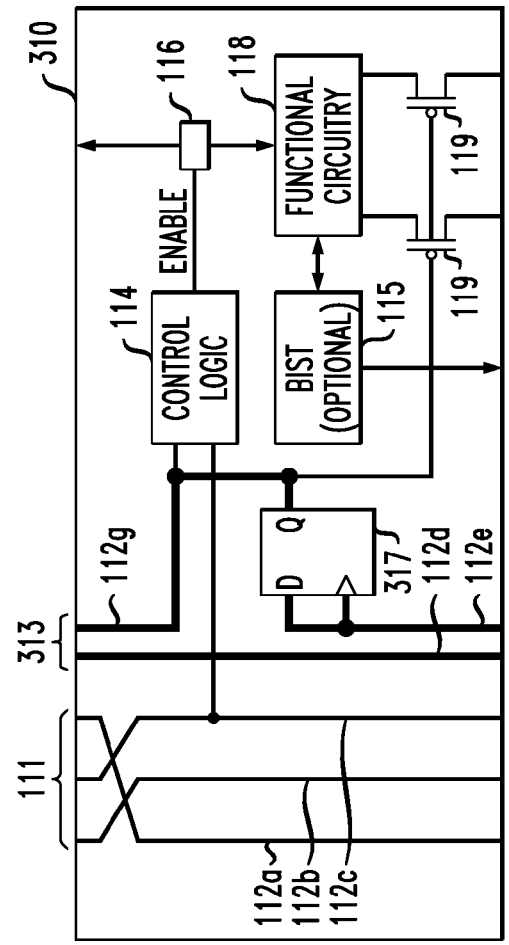
FIG. 11 is a detailed block diagram of one of the dies of FIG. 10.
Figure 10:
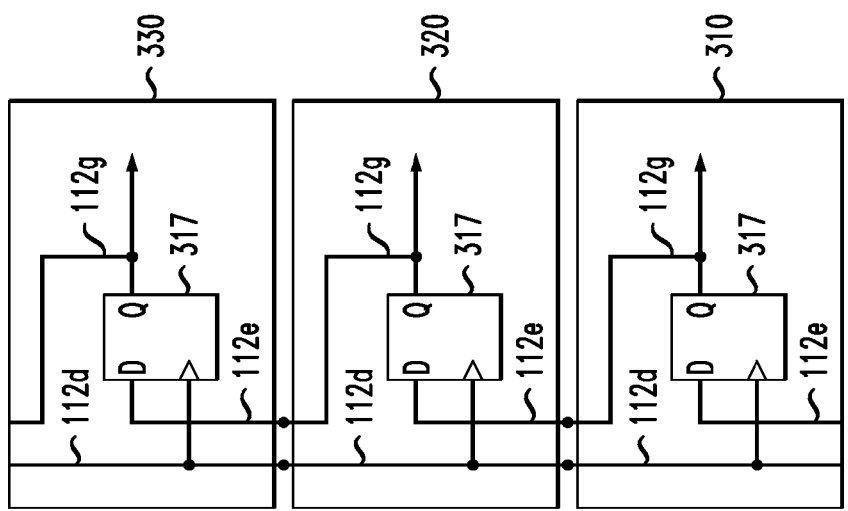
FIG. 10 is a block diagram of a embodiment of a die stack, in which the operation block of the dies include latches.

FIGS. 10 and 11 show another embodiment of a die stack 300 employing a shift register structure, including latches 317 in each of three dies 310, 320 and 330. FIG. 11 shows details of an exemplary die 310. Dies 320 and 330 may be the same as die 310, or may include different functional circuitry 118 and BIST circuitry 115. Several elements of die 310 may be the same as die 110 (FIG. 2), including functional circuitry 118, BIST 115, transistors 119, data bus output switch 116, control logic 114 and output enable block 111, including electrical connections 112a-112c. For brevity, detailed descriptions of these items are not repeated. In addition, several details shown in FIG. 11 are omitted from FIG. 10 for clarity.

As shown in FIGS. 10 and 11, the operation block 313 is replaced in die 310 by a latch 317, which may be a D flip-flop, for example. In this configuration, electrical connection 112d carries the clock signal, and electrical connection 112e is a serial data input. The respective operation block 313 in each IC die 310, 320, 330 includes a latch 317 having an output coupled to control logic 114 for selectively enabling communication between the functional circuitry 118 and the data bus if the output of the latch 317 has a first predetermined state. The first IC die 310 has a first electrical connection 112g coupled to the output of the latch 317; and the second IC die 320 has a second electrical connection 112e coupled to the first electrical connection 112g. The second electrical connection 112e provides an input to the latch 317 of the second IC die 320.

To drop the first die 310 using the latches 317 of this shift register structure, the data "001" is shifted (MSB first) into the latches 317. To drop the second die 320, the data "010" is shifted (MSB first) into the registers. To drop the third die 330, the data "100" is shifted (MSB first) into the registers.

FIG. 12 is a flow chart of a method of configuring a 3D IC to bypass a die and use a redundant die.

At step 1200 a test of at least one circuit 118 is performed using a BIST circuit 115 in each IC die 110, 120, 130, and/or software test patterns, in a 3D IC package 160, 180. The package 160, 180 has a plurality of stacked IC dies 110, 120, 130 that are operable independently of each other by way of electrical connections 112a-112f in each of the stacked IC dies.

At step 1202, test results of the BIST circuit 115 and/or the software test patterns are transmitted to the CPU or FSM 150.

At step 1204, the CPU or FSM 150 evaluates the results of the self test and decides whether to maintain the current configuration of active IC dies, or swap out a failed or poorly performing die and swap in the redundant die. For example, if the SiP 100 is currently operating with IC dies 110 and 120 active and die 130 disconnected from power, CPU/FSM 150 may decide to replace die 120 with die 130. Once the decision is made, the CPU sets the operation switch signal based on a result of the test performed in each IC die.

At step 1206, the operation signal and output enable signal are provided to each IC die in the stack 110, 120, 130 by way of the electrical connections 112a-112f.

At step 1208, the operation signal is used to selectively bypass one of the IC dies if the operation signal has a predetermined logic state.

At step 1210, the output enable signal is used to selectively enable communication between at least one circuit in one of the remaining IC dies and at least one data bus. In some embodiments of the method, the plurality of IC dies includes three or more IC dies, the at least one data bus includes two data buses, and the step of using the output enable signal comprises selectively enabling communication between the circuits in two remaining IC dies and the two data buses, under control of decoding logic, in response to the operation signal and the output enable signal.

The methods described above may be used to increase 3D IC chips' reliability and life time. For example, one or more redundant dies may be included within a 3D IC. During normal operation, the redundant die is bypassed. Upon detection of a failure of one of the dies, the redundant die is put in the operational state and the failed die is bypassed, and is no longer allocated time slots for bus access.

In some embodiments, in addition to increasing reliability, power consumption may be reduced by disconnecting one of the dies from power, because a redundant IC does not consume any power during normal operation of the remaining ICs, and the failed IC die which is taken out of service does not draw any power subsequently. Many other uses will be apparent to those of ordinary skill.

Although the examples above describe the use of the method to replace a failed or compromised die with a good die, in other embodiments, the die that is operational may be different from the die that is bypassed (and may be different from the rest of the N stacked IC dies in functionality). In one embodiment, a first die is optimized for performance and a second die is optimized for efficiency and low power consumption. Based on dynamic conditions, the CPU/FSM 150 may decide to activate the first die for performing a numerically intensive application, or to activate the second die at other times.

In some embodiments, the apparatus includes a stack of dies 150, 110, 120, 130, as shown in FIG. 1B. The first die has a first memory 118a (FIG. 2) with a first memory storage capacity, a first function and a first power consumption rate. The second die has a second memory 118a with a second memory storage capacity different than the first storage capacity, a second function different from the first function, and a second power consumption rate different from the first power consumption rate. The operation block 113 (FIG. 2) is configurable to select either the first or second die for operation, based on storage capacity, function or power.

In some embodiments, an apparatus comprises a first integrated circuit (IC) die, and a second IC die stacked on the first IC die. The first and second IC dies are operational independently of each other. Each respective one of the first and second IC dies has: at least one circuit for performing a function; an operation block coupled to selectively disconnect the circuit from power; and an output enable block coupled to selectively connect the circuit to at least one data bus.

In some embodiments, an apparatus comprises N stacked integrated circuit (IC) dies, where N is an integer greater than one. Each one of the IC dies is operational independently of each other IC die. Each respective one of the N IC dies has at least one circuit for performing a function. An output enable block is coupled to selectively connect the circuit to at least one data bus. The output enable block in each IC die comprises N output enable electrical connections, one of the output enable electrical connection corresponding to the one IC die, and control logic coupled to the circuit and to the output enable electrical connection corresponding to the one IC die. The control logic is configured so that the circuit only outputs data to the at least one data bus when the output enable electrical connection of the one IC die carries a signal having a predetermined logic state.

In some embodiments, a method comprises providing an operation signal and an output enable signal to each integrated circuit (IC) die in a package having a plurality of stacked IC dies that are operable independently of each other by way of electrical connections in each of the stacked IC dies. The operation signal is used to selectively disconnect one of the IC dies from power if the operation signal has a predetermined logic state. The output enable signal is used to selectively enable communication between at least one circuit in one of the remaining IC dies and at least one data bus.

Although the subject matter has been described in terms of exemplary embodiments, it is not limited thereto. Rather, the appended claims should be construed broadly, to include other variants and embodiments, which may be made by those skilled in the art.

What is claimed is:

1. An apparatus comprising:
a die stack having a first integrated circuit (IC) die, and a second IC die stacked above the first IC die, each respective one of the first and second IC dies at or below a topmost IC die position of the die stack and having:
at least one circuit for performing a function; and
an operation block coupled to output at least one first signal to selectively bypass that respective die from operations, wherein the operation block of one of the first IC die or the second IC die is configured to selectively bypass the one IC die from operations while the other of the first IC die or the second IC die remains in operation; and
control logic coupled to the at least one first signal, the control logic being configured to discontinue communication between the at least one circuit and at least one data bus if the at least one first signal has a first predetermined logic state.

2. The apparatus of claim 1, wherein
the respective operation block is electrically connected to the circuit, such that when the at least one first signal has the first predetermined logic state, the corresponding die is bypassed from operations.

3. The apparatus of claim 1, wherein:
each respective one of the first and second IC dies comprises an output enable block coupled to selectively connect the circuit to the at least one data bus, and
the output enable block in each IC die is configured with M output enable block electrical connections to control N IC dies, where M and N are integers and M>=N,
each of the output enable block electrical connections in each IC die are configured to connect to output enable block electrical connections of a successive output enable block in an adjacent one of the IC dies.

4. The apparatus of claim 1, wherein:
the first die has a first memory with a first memory storage capacity, a first function and a first power consumption rate;
the second die has a second memory with a second memory storage capacity different than the first storage capacity, a second function different from the first function, and a second power consumption rate different from the first power consumption rate; and
the operation block is configurable to select either the first or second die for operation, based on storage capacity, function or power.

5. The apparatus of claim 1, wherein:
the first die has a contact map for power and signals; and
the second die has a contact map for power and signals that matches the contact map of the first die.

6. The apparatus of claim 1, wherein each operation block comprises a plurality of through substrate vias.

7. The apparatus of claim 6, wherein each operation block further comprises a respective multiplexer corresponding to each respective through substrate via of the operation block.

8. The apparatus of claim 1, wherein each operation block comprises a respective latch having an output coupled to the control logic.

9. Apparatus comprising:
a die stack having a first integrated circuit (IC) die, and a second IC die stacked above the first IC die, each respective one of the first and second IC dies at or below a topmost IC die position of the die stack and having:
at least one circuit for performing a function, being electrically connectable to a first and a second data buses;
an operation block coupled to output at least one first signal to selectively bypass the respective die from operations, wherein the operation block of one of the first IC die or the second IC die is configured to selectively bypass the one IC die from operations while the other of the first IC die or the second IC die remains in operation; and control logic coupled to the at least one first signal, the control logic being configured to discontinue communication between the at least one circuit and the first and second data buses if the at least one first signal has a first predetermined logic state.

10. The apparatus of claim 9, wherein
the respective operation block is configurable, such that when the at least one first signal has a first predetermined logic state, the corresponding die is bypassed from operations.

11. The apparatus of claim 9, wherein:
the first die has a first memory with a first memory storage capacity, a first function and a first power consumption rate;
the second die has a second memory with a second memory storage capacity different from the first storage capacity, a second function different from the first function, and a second power consumption rate different from the first power consumption rate; and
the operation block is configurable to select either the first or second die for operation, based on storage capacity, function or power.

12. The apparatus of claim 9, wherein:
the first die has a contact map for power and signals; and
the second die has a contact map for power and signals that matches the contact map of the first die.

13. The apparatus of claim 9, wherein:
each respective one of the first and second IC dies comprises an output enable block coupled to selectively connect the circuit to at least one of the first or second data bus, and
the output enable block in each IC die is configured with M output enable block electrical connections to control N IC dies, where M and N are integers and M>=N,
each output enable block electrical connection in each IC die is configured to connect to the output enable block electrical connections of a successive output enable block in an adjacent one of the IC dies.

14. The apparatus of claim 9, wherein the first and second data buses are on first and second separate chips from the first and second IC dies, and are on separate chips from each other.

15. Apparatus comprising:
a die stack having N stacked integrated circuit (IC) dies, where N is an integer greater than one, one of the N stacked integrated circuit dies is a redundant die, each respective one of the N IC dies at or below a topmost IC die position of the die stack and having:
at least one circuit for performing a function;
an operation block coupled to output at least one first signal to selectively bypass the respective die from operations, wherein the operation block of one of the IC dies is configured to selectively bypass the one of the IC dies from operation, while at least another of the IC dies remains in operation; and
control logic coupled to the at least one first signal, the control logic being configured to discontinue communication between the at least one circuit and at least one data bus if the at least one first signal has a first predetermined logic state.

16. The apparatus of claim 15, wherein:
the respective operation block is configurable, such that when the at least one first signal has a first predetermined logic state, the corresponding die is bypassed from operations.

17. The apparatus of claim 15, wherein:
a first die in the N stacked integrated circuit dies has a first memory with a first memory storage capacity, a first function and a first power consumption rate;
a second die different from the first die in the N stacked integrated circuit dies has a second memory with a second memory storage capacity different from the first storage capacity, a second function different from the first function, and a second power consumption rate different from the first power consumption rate; and
the operation block is configurable to select either the first or second die for operation, based on storage capacity, function or power.

18. The apparatus of claim 15, wherein each respective one of the N IC dies further comprises an output enable block coupled to selectively connect the at least one circuit to the at least one data bus, the output enable block in each IC die comprising M output enable electrical connections, where M is an integer and greater than or equal to N.

19. The apparatus of claim 15, wherein the respective circuit for performing a function in each of the N IC dies is different from the respective circuits for performing a function in the others of the N IC dies.

20. The apparatus of claim 19, wherein each one of the N IC dies includes a respectively different built-in self-test circuit for testing the respective circuit for performing a function in that one of the N IC dies.

21. An apparatus comprising:
a die stack having a first integrated circuit (IC) die, and a second IC die stacked above the first IC die, each respective one of the first and second IC dies at or below a topmost IC die position of the die stack and having:
at least one circuit for performing a function; and
an operation block coupled to receive a fixed input value and output at least one first signal in response to receiving the fixed input value, to selectively bypass that respective die from operations, wherein the operation block of one of the first IC die or the second IC die is configured to selectively bypass the one IC die from operations while the other of the first IC die or the second IC die remains in operation,
wherein the fixed input value corresponding to the operation block of the first IC die is the same as the fixed input value corresponding to the operation block of the second IC die.

22. The apparatus of claim 21, wherein the operation block is configured so that the fixed input value does not change between selectively bypassing the first IC die and selectively bypassing the second IC die.

* * * * *